(12) United States Patent
Wickeraad et al.

(10) Patent No.: US 8,245,109 B2
(45) Date of Patent: Aug. 14, 2012

(54) ERROR CHECKING AND CORRECTION (ECC) SYSTEM AND METHOD

(75) Inventors: John Alan Wickeraad, Granite Bay, CA (US); King Luk, Elk Grve, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1283 days.

(21) Appl. No.: 11/394,949

(22) Filed: Mar. 31, 2006

(65) Prior Publication Data
US 2007/0234182 A1 Oct. 4, 2007

(51) Int. Cl.
*G11C 29/00* (2006.01)
(52) U.S. Cl. ....................................................... 714/763
(58) Field of Classification Search ................. 714/763, 714/6, 52, 768
See application file for complete search history.

(56) References Cited

U.S. PATENT DOCUMENTS

| | | | | |
|---|---|---|---|---|
| 4,782,487 A * | 11/1988 | Smelser | 714/723 |
| 5,668,967 A * | 9/1997 | Olson et al. | 710/22 |
| 5,731,945 A * | 3/1998 | Bertin et al. | 361/111 |
| 5,959,914 A * | 9/1999 | Gates et al. | 365/201 |
| 6,438,726 B1 * | 8/2002 | Walters, Jr. | 714/764 |
| 6,510,537 B1 * | 1/2003 | Lee | 714/763 |
| 7,546,515 B2 * | 6/2009 | Gross et al. | 714/763 |
| 2004/0216027 A1 * | 10/2004 | Ueno | 714/758 |
| 2006/0136656 A1 * | 6/2006 | Conley et al. | 711/103 |
| 2009/0044061 A1 * | 2/2009 | Visconti | 714/718 |

* cited by examiner

*Primary Examiner* — M. Mujtaba K Chaudry
*Assistant Examiner* — Enam Ahmed

(57) ABSTRACT

A method stores data and check bits for that data within a memory chip. The memory chip stores the data and check bits in a plurality of pages contained in the memory chip, each page including a plurality of storage locations with each storage location having an associated address. The method includes receiving data to be stored in the memory, calculating check bits for the received data, mapping the data to addresses associated with the storage locations in a given page in the memory chip, mapping the check bits to addresses associated with the storage locations contained in the same page as the data, and storing the data and check bits in the page. The method may be applied to a single memory chip or to multiple memory chips.

20 Claims, 4 Drawing Sheets

ERROR CHECKING AND CORRECTION (ECC) SYSTEM AND METHOD

BACKGROUND OF THE INVENTION

In many computer systems, error checking and correction (ECC) is used to detect and correct errors in data stored in a memory of the computer system. To protect data using error checking and correction, an algorithm is applied to the data before the data is stored in the memory, with the algorithm generating a corresponding error correcting code. Depending upon the type of error checking and correction being utilized, the code may allow the detection of one or more erroneous bits in the data and may also allow for the correction of one or more such erroneous bits. For example, a common type of error checking and correction is known as single error correction double error detection (SECDED). With this type of error checking and correction, an SECDED code is calculated for data and may be utilized to detect single or double bit errors in the data while allowing for the correction of single bit errors.

A simple parity bit may be viewed as the simplest type of error checking and correction, although technically parity bits allow only for the detection and not the correction of bit errors in store data. A parity bit is a bit appended to a group of data bits and having a value such that the number of binary 1's in the overall word formed by the data and parity bits has either an even or an odd number of binary 1's. In the present description, the term error checking and correction (ECC) is used generally to refer to any type of error detection alone or to any type of error checking and correction. Also, the terms check bits, check byte, and ECC bits, or check word may be used interchangeably in the present description to refer to the bits or groups of bits generated by the ECC algorithm or process being utilized.

FIG. 1 is the block diagram of a conventional memory module 100 including a number of random access (RAM) chips 102a-n. The memory module 100 further includes an ECC RAM chip 104 for storing check bits that allow erroneous bits in the RAM chips 102a-n to be detected and possibly corrected. As the data is stored in the RAM chips 102a-n, circuitry (not shown) on the memory module 100 calculates the corresponding check bits for that data and stores these check bits in the ECC RAM 104. The operation of the RAM chips 102a-n an ECC RAM chip 104 will be understood by those skilled in the art, and thus will now be explained only very briefly. Each of the RAM chips 102a-n has a large number of memory cells (not shown) arranged in rows and columns within the chip. Each memory cell has an associated address and to access that cell a corresponding address is applied to the memory module and then data is either written to or read from the addressed memory cells. Rows of memory cells are typically referred to as pages, with the address applied to the memory module 100 including a row address component corresponding to a respective row or page within the RAM chips 102a-n. In response to a given row address, the corresponding page within the RAM chips 102a-n is accessed and thereafter particular memory cells in the page are accessed as determined by a column address component of the applied address.

In operation, to write data into the memory module 100 an address is first applied to the memory module. In response to the applied address, corresponding memory cells in the RAM chips 102a-n are accessed and the data to be stored in the addressed cells is thereafter written into and stored in these memory cells. From the data being written into the addressed memory cells, circuitry on the memory module 100 calculates corresponding check bits and stores these check bits in the ECC RAM chip 104.

When data is read from the memory module 100, once again an address is first applied to the module. The corresponding memory cells in the RAM chips 102a-n are then accessed and the data is read out of these memory cells. At the same time, circuitry on the memory module 100 accesses the check bits associated with the addressed memory cells. The circuitry then utilizes the data read out of the addressed memory cells to calculate new check bits for this data and compares these new check bits to the check bits read from the ECC RAM chip 104. If the new check bits read from the ECC RAM chip 104 are the same, then there are no errors in the read data. If the new check bits are different from the check bits read from the ECC DRAM chip 104, however, then this means the data stored in the RAM chips 102a-n is now different than the data originally stored in the cells and thus an error in the data exists. Depending on the type of check bits stored in the ECC RAM 104, at this point the circuitry on the memory module 100 may generate an error flag indicating an error in data stored in the memory module has been detected or the circuitry may correct the detected error if possible.

While this type of error checking and correction is satisfactory in many applications, the inclusion of this error checking and correction functionality on the memory module 100 increases the cost of the memory module. This is true due to the requirement for the additional ECC RAM chip 104 and also due to the additional circuitry (not shown) contained on the memory module for calculating the check bits and utilizing the calculated check bits to detect and possibly correct errors in the data stored in the RAM chips 102a-n. As shown in FIG. 1, the ECC RAM chips 102a-n collectively form the actual data storage 106 portion of the memory module 100, with the extra ECC chip 104 merely storing check bits to detect and possibly correct errors in the stored data and not being available for use by programs running on a computer system (not shown) including the module 100.

In addition, the inclusion of error checking and correction on the memory module 100 may result in reduced performance of the memory module particularly during some types of data transfer operations, such as read-modify-write (RMW) operations which can result in consecutive read and write operations to a given page in the RAM chips 102a-n. Such RMW operations take an undesirably long time to complete due to the delay in calculating the check bits for each such consecutive data transfer operation, lowering the overall performance of the memory module 100 as will be appreciated by those skilled in the art.

There is a need for an improved system and method for providing error checking and correction in the memory of a computer or other type of electronic system.

SUMMARY OF THE INVENTION

According to one aspect of the present invention, a method stores data and check bits for that data within a single memory chip. The memory chip stores the data and check bits in a plurality of pages contained in the memory chip, each page including a plurality of storage locations with each storage location having an associated address. The method includes receiving data to be stored in the memory, calculating check bits for the received data, mapping the data to addresses associated with the storage locations in a given page in the memory chip, mapping the check bits to addresses associated with the storage locations contained in the same page as the data, and storing the data and check bits in the page.

According to another aspect of the present invention, a data path has a memory bus adapted to be coupled to a memory device and a processor bus adapted to be coupled to a processor. The data path is operable during a write mode of operation to receive from the processor bus respective data words to be stored in the memory device and to generate corresponding check bits for each received data word. The data path is further operable store the data words and an error checking word including the check bits in a respective page in the memory device. The data is operable during a read mode of operation to receive on the memory bus the data words and the error checking word from a respective page in the memory device. The data path is further operable to utilize the bits in the error checking word to detect errors in the received data words.

DETAILED DESCRIPTION OF PREFERRED EMBODIMENTS

Figure 1:
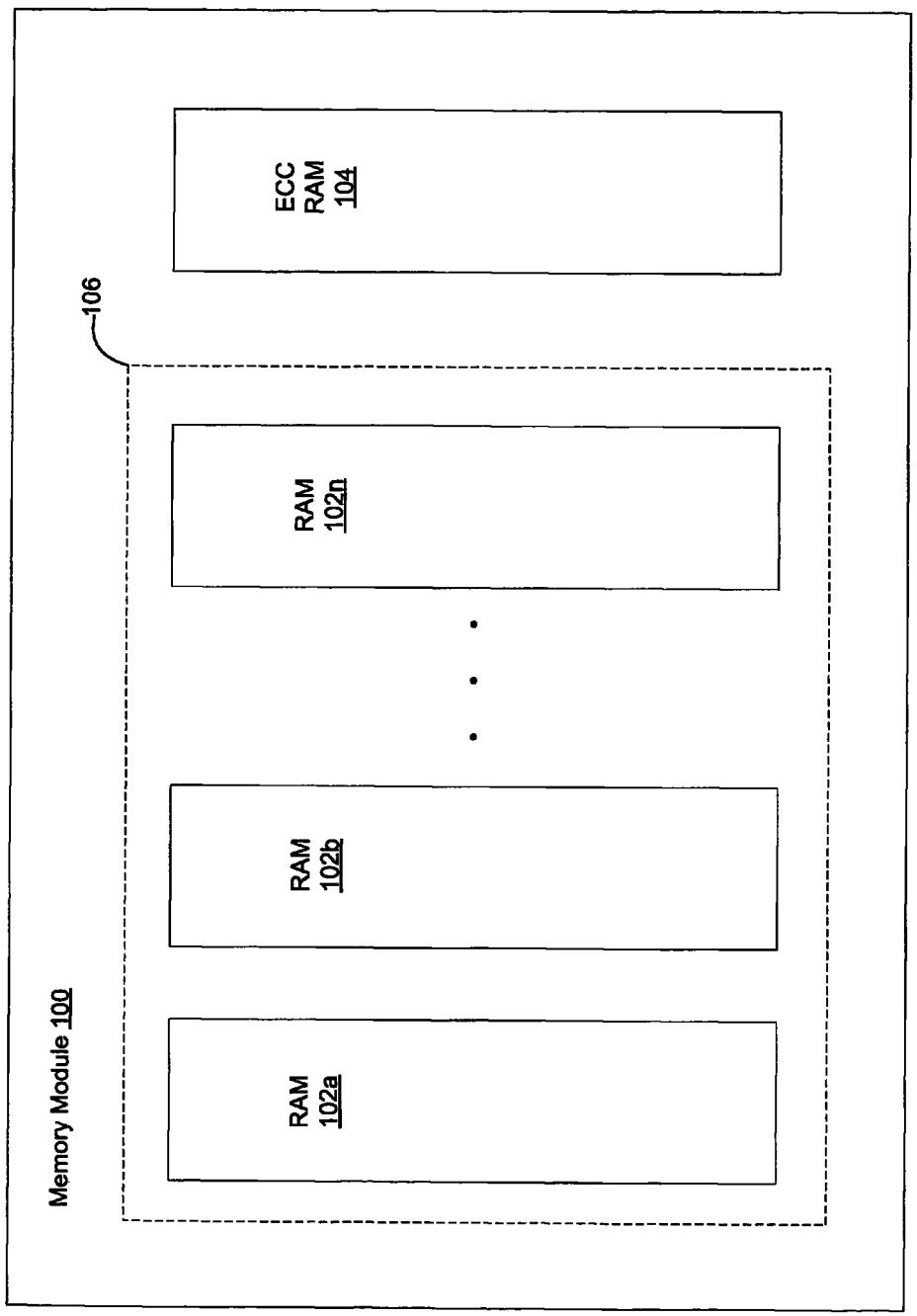
FIG. 1 is a simplified block diagram of a conventional memory module including a separate ECC RAM chip for performing error checking and correction.
Figure 2:
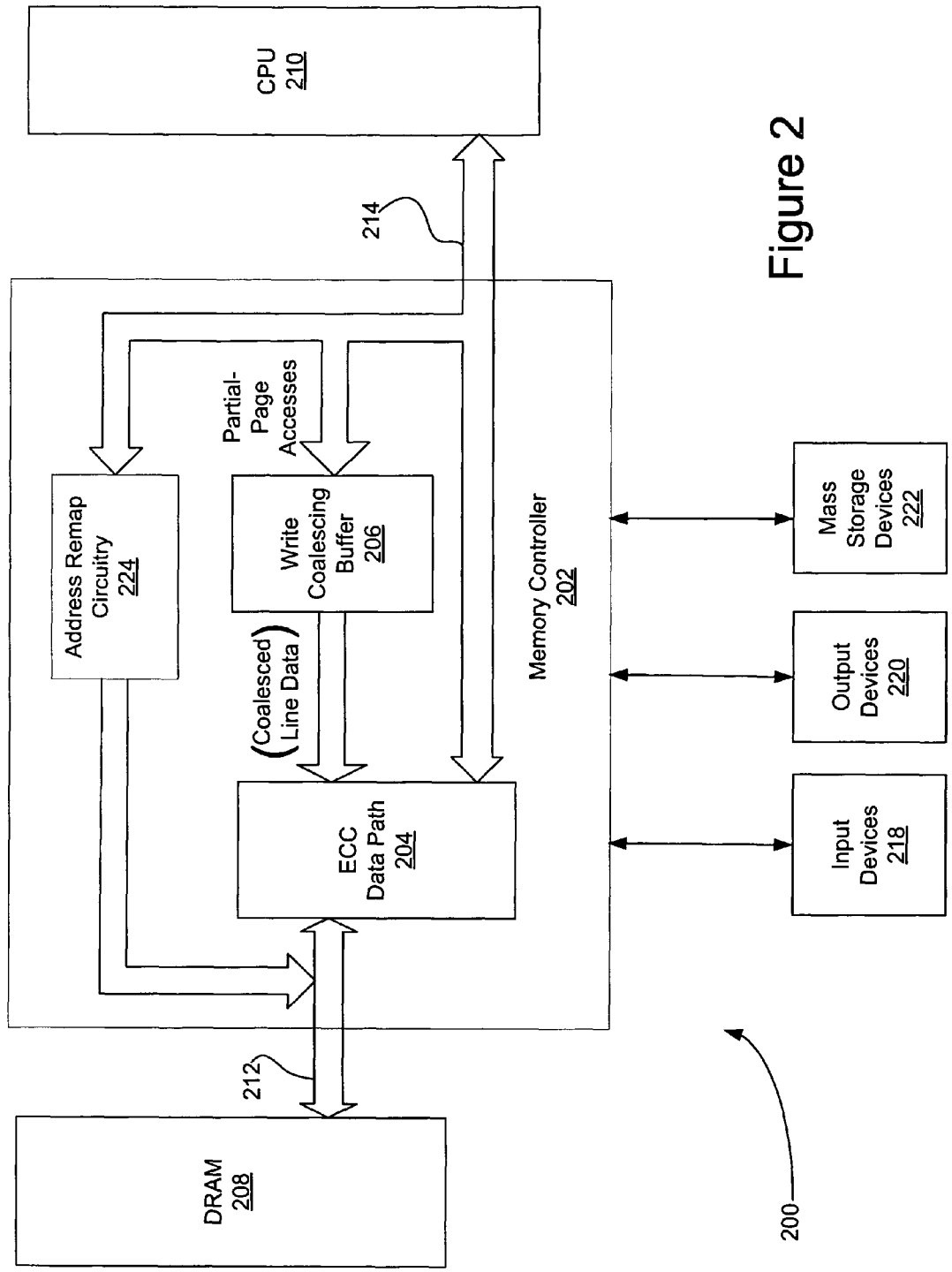
FIG. 2 is a functional block diagram of a computer system including a memory controller an error checking and correction data path and write coalescing buffer according to one embodiment of the present invention.

FIG. 2 is a functional block diagram of a computer system 200 including a memory controller 202 having an error checking and correction data path 204 and write coalescing buffer 206 according to one embodiment of the present invention. In operation, the ECC data path 204 and the write coalescing buffer 206 operate in combination during write operations to store data words and the corresponding check bits for those data words in a given page within a single DRAM 208. During read operations, the ECC data path 204 retrieves a data line within a given page in the DRAM 208 and determines whether the data words in that data line contain any errors using the corresponding check bits contained in the page. The write coalescing buffer 206 functions to improve the efficiency read-modify-write operations to the DRAM 208 by buffering modified data words or bytes being written to a given page within the DRAM. These data words or bytes are buffered until some other triggering event occurs, such as a request to access to a different line within the currently open page in the DRAM 208, as will be explained in more detail below.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

In the computer system 200, a central processing unit (CPU) 210 transfers data to and from the DRAM 208 through the memory controller 202. The DRAM 208 is coupled to the ECC data path 204 through a memory bus 212 that includes address, control, and data buses through which the memory controller 202 interfaces with the DRAM. Similarly, the CPU 210 is coupled to the memory controller 202 through a processor bus 214 that also includes address, data, and control busses. The computer system 200 further includes one or more input devices 218, such as a keyboard or a mouse, coupled to the memory controller 202 to allow an operator to interface with the computer system. Typically, the computer system 200 also includes one or more output devices 220 coupled to the memory controller 202, such output devices typically including a printer and a video terminal. One or more mass data storage devices 222 are also typically coupled to the memory controller 202 to store data or retrieve data from external storage media (not shown). Examples of typical storage devices 222 include hard and floppy disks, tape cassettes, compact disk read-only (CD-ROMs) and compact disk read-write (CD-RW) memories, and digital video disks (DVDs).

The memory controller 202 further includes address remap circuitry 224 coupled to the processor bus 214 to receive logical memory addresses from software running on the CPU 210. In response to the logical memory addresses, the address remap circuitry 224 converts or "remaps" these logical addresses into physical addresses (i.e., addresses seen by the DRAM 208) that are then applied over the memory bus 212 to access corresponding memory cells in the DRAM 208. In operation, the address remap circuitry 224 remaps the logical memory addresses from the CPU 210 so that the check bits for data lines stored in a given page in the DRAM 208 are stored in the same page.

Figure 3:
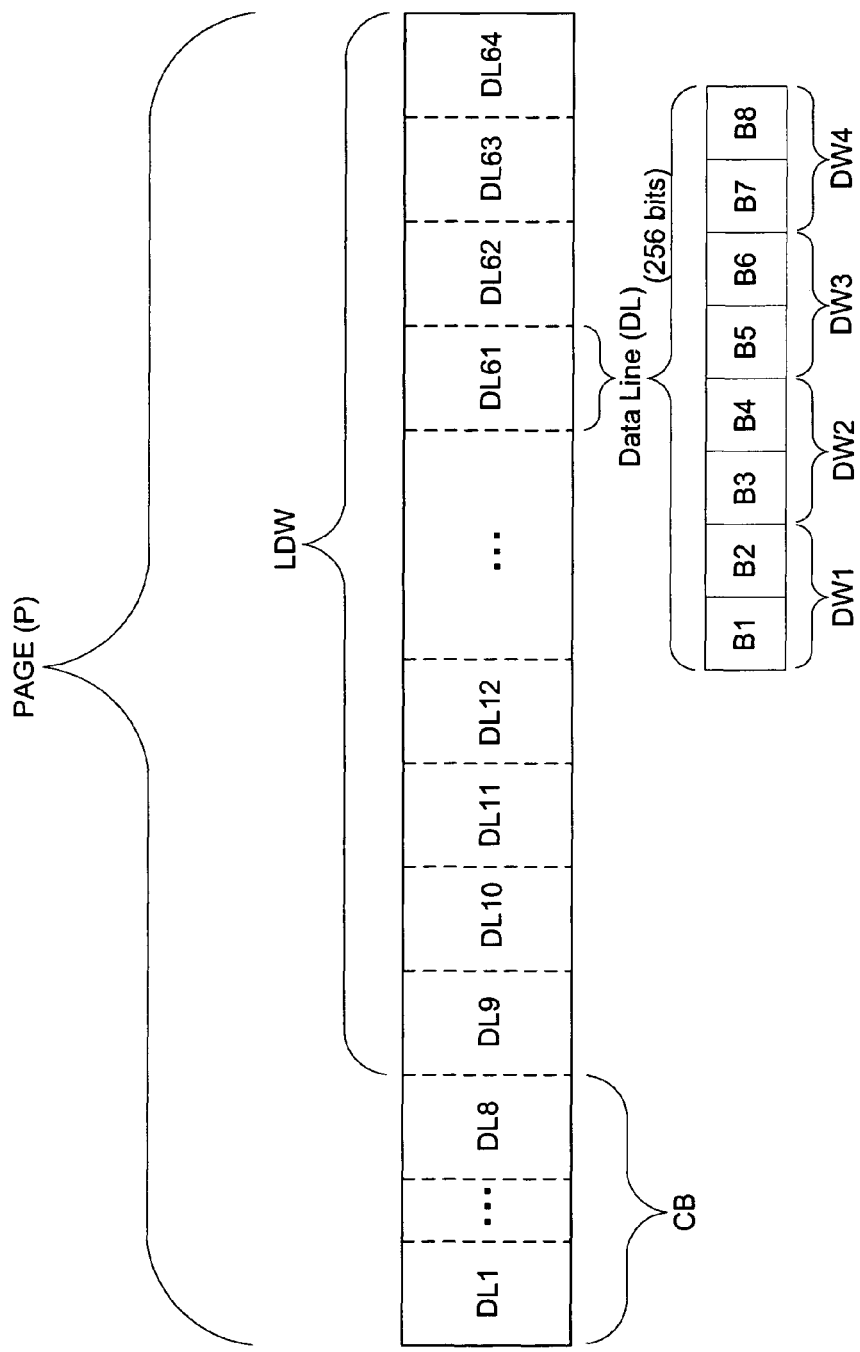
FIG. 3 is a diagram illustrating a page of data contained within the DRAM of FIG. 2 along with bytes, data words, a page data word, and a check byte that collectively form the page.

To read data from the DRAM 208, the CPU 210 applies a read command in the form of appropriate control and address signals to the memory controller 202 over the processor bus 214. In response to the read command, the data path 204 and the address remap circuitry 224 in the memory controller 202 operate in combination to apply appropriate address and control signals over the bus 212 to access a line of data in desired page within the DRAM 208. Before continuing with the description of a read operation, the format in which data is stored in the DRAM 208 will first be described with reference to FIG. 3. As shown in FIG. 3, a page P of data includes 64 data lines DL1-DL64, with a data portion of the page being designated a line data word LDW that consists of the data lines DL9-DL64. Each data line DL is typically the smallest unit of data accessible in an open or activated page P. In addition to the data word LDW, each page P includes a number of check bits that are collectively designated a check byte CB and are formed by data lines DL1-DL8. The check byte CB has a value that is calculated using the data lines DL9-DL64 in the LDW word and which enables errors in the LDW word to be detected and possibly corrected, depending on the type of error checking and correction algorithm being utilized.

FIG. 3 also shows that each data line DL further includes eight bytes B1-B8 as shown by way of example for the data line DL61. In this embodiment, each data line DL includes 256 bits so that each byte B1-B8 corresponds to a 32-bit byte. A data word DW formed by two bytes B and thus each data line DL includes four data words DW1-DW4 as shown in FIG. 3 and as will be discussed in more detail below. In the example embodiment of FIG. 3, each page P is 512 bytes (32-bit bytes, or 2048 (2K) 8-bit bytes long) such that there are the 64 data lines DL1-DL64 in each page, with each data line being 256 bits or eight 32-bit bytes B long. As previously mentioned, the data line DL is typically the smallest unit of data accessible in each page P and in the present description data being transferred to or from an open or activated page may be discussed in terms of data lines or alternatively in terms of data words DW and bytes B.

Note that FIG. 3 is merely an example illustrating one page P merely for purposes of illustration and to assist in the following description of the operation of the ECC data path 204 and write coalescing buffer 206. The salient point of this figure is that both the page data in the form of the line data word LDW along with check bits for that data word in the form of the check byte CB are stored in the same page P in the DRAM 208. The location of the check byte CB in the page P along with the numbers of data lines DL, number of bytes B in each data line, and the definition of data words DW will vary in different embodiments of the present invention. In all such embodiments, however, each line data word LDW along with the associated check bits forming the check byte CB for that line data word are stored in the same page P in the DRAM 208. The address remap circuitry 224 remaps logical addresses from the CPU 210 to ensure that this is the case, as previously described.

Returning now to FIG. 2 and to the discussion of a read operation, the ECC data path 204 and address remap circuitry 224 in the memory controller 202 apply appropriate address and control signals over the memory bus 212 to activate an addressed page P in the DRAM 208 and to thereafter access the addressed data line DL in that page. In accessing the addressed page P and data line DL, the ECC data path 204 first accesses the check byte CB and thereafter utilizes portions of this check byte to detect errors in the addressed data line DL as bytes B1-B8 of this data line are sequentially read into the data path. In the example embodiment of FIG. 2, the width of the memory bus 212 is assumed to have the width of a single byte B. Therefore, in the addressed page P in the DRAM 208 the check byte CB is initially transferred one byte B at a time over the memory bus 212 to the data path 204. After the check byte CB, the bytes B1-B8 of the addressed data line DL are sequentially transferred over the bus 212 to the data path. Since the ECC data path 204 initially receives the check byte CB, the data path can then use portions of the check byte to sequentially check for errors as the bytes B1-B8 are sequentially received.

Recall that in the example embodiment being described in more detail to better illustrate the operation of the data path 204, each of the data lines DL is 256 bits or 8 bytes wide with each byte B being 32 bits wide. Each data word DW1-DW4 is therefore 64 bits wide and the line data word LDW is 512 bytes wide in this example. The check byte CB includes the lines DL1-DL8, with groups of check bits in the check byte corresponding to the check bits calculated for respective ones of the data words DW1-DW4 in the data lines DL9-DL64 forming the line data word LDW in assessed page P. Accordingly, during a read operation the data path 204 initially receives the check byte CB and thereafter latches the addressed data line DL.

When the first two bytes B1 and B2 of the addressed data line DL have be latched, the data path 204 utilizes corresponding bits in the check byte CB to determine whether the data word DW1 formed by these bytes contains any errors. While the data path 204 is determining whether the first data word DW (bytes B1 and B2) in the addressed data line DL contains any errors, the data path is simultaneously latching the next two bytes B3 and B4 corresponding to the second data word DW2 in the addressed data line. Once the data path 204 has latched the next two bytes B3 and B4 corresponding to the second data word DW2 and has completed determining whether the first data word DW1 contains any errors, the data path then moves on and determines whether the second data word DW2 formed by the bytes B3 and B4 contains any errors. To do so, the data path 204 again utilizes a second group of check bits in the check byte CB. Once again, while the data path 204 is determining whether the second data word DW2 contains any errors, the data path is simultaneously latching the next two bytes B5 and B6 corresponding to the third data word DW3 in the addressed data line DL. The data path 204 thereafter utilizes a third group of check bits in the check byte CB to determine whether the third data word DW3 contains any errors. Finally, while the data path 204 is determining whether the third data word DW contains any errors, the data path is simultaneously latching the final two bytes B7 and B8 in the addressed data line DL corresponding to the fourth data word DW. The data path 204 thereafter utilizes a final group of check bits in the check byte CB to determine whether the fourth data word DW4 contains any errors.

When the data path 204 determines that none of the data words DW1-DW4 in the addressed data line DL contains any errors, the data path communicates the data words DW1-DW4 over the processor bus 214 to the CPU 210 for appropriate processing by the CPU. If the data path 204 determines that any of the data words DW1-DW4 contains an error, the data path communicates an error flag over the processor bus 214 to the CPU 210. In response to the error flag, the CPU 210 takes appropriate action, such as displaying an error message on a suitable one of the output devices 220 to notify a user of the error and allow the user to take appropriate action.

The operation of the memory controller 202 and ECC data path 204 during a write operation will now be described. The first write operation to be described is a conventional write operation in which data is written to all data lines DL in a given memory page P. To write data into a desired data line DL within a memory page P in the DRAM 208, the CPU 210 applies a write command in the form of appropriate control and address signals to the memory controller 202 over the processor bus 214. In addition to the write command, the CPU 210 supplies the write data to be stored in the desired line within the DRAM 208 to the memory controller 202 over the processor bus 214. The width of the data bus portion of the processor bus 214 will of course determine precisely in what form the write data is transferred to the memory controller 202. For the purposes of the present description, the data bus portion of the processor bus 214 is assumed to be 128 bits wide. As a result, the CPU 210 transfers a first two 64-bit data words DW1 and DW2 at the same time over the processor bus 214 to the data path 204 within the memory controller 202. The CPU 210 thereafter transfers a second two 64-bit data words DW3 and DW4 at the same time over the processor bus 214 to the data path 204.

Within the memory controller 202, the data path 204 latches the data words DW1-DW4 as they are received and the address remap circuitry 224 does the same with applied logical addresses, and these to operate in combination to apply the appropriate control and address signals on the memory bus 212 to access the desired page P within the DRAM 208. The data path 204 then supplies these data words DW1-DW4 on the data bus portion of the memory bus 212 to thereby write each of these data words into the addressed data line DL and activated page P within the DRAM 208. As the data path 204 writes each data word DW1-DW4 into the addressed data line DL within the DRAM 208, the data path calculates the corresponding group of check bits for each of the data words. More specifically, as the data path 204 writes the first data word DW1 into the DRAM 208 the data path calculates a corresponding first group of check bits for this data word. The data path 204 thereafter does the same for the second data word DW2 and calculates a corresponding second group of check bits for the second data word as the data path is writing the second data word into the DRAM 208. In the same way, the data path 204 generates third and fourth groups of check bits for the third and fourth data words DW3 and DW4 as each of these data words is written into the addressed data line within the DRAM 208.

Once the data path 204 has written all four data words DW1-DW4 into the activated page P and addressed data line DL within the DRAM 208, the data path has calculated the respective groups of check bits for each of these data words. The data path 204 then combines these four groups of check bits to form a corresponding portion of the check byte CB for the data words DW1-DW4 stored in the addressed data line DL. The data path 204 then repeats these operations for each data line DL in the activated page P, storing new data for that data line and calculating corresponding check bits. Once the data path 204 has done this for all data lines DL in the activated page P, the data path 204 writes the check byte CB into the activated page within the DRAM 208 to complete the write operation.

The operation of the address remap circuitry 224, ECC data path 204, and write coalescing buffer 206 during a read-modify-write operation will now be described. A read-modify-write operation is a data transfer operation that: 1) accesses a data line DL in the DRAM 208; 2) reads the line data word LDW stored in the accessed page P; 3) modifies only a portion of the line data word LDW contained in the accessed page; and 4) then stores or writes the new line data word including the modified portion into the accessed page. Such data transfer operations may commonly occur in some applications being executed by the CPU 210, such as graphics applications for displaying images on one of the output devices 220, as will be understood by those skilled in the art. In the following description, it is assumed that one or more data lines DL are being modified during the read-modify-write operation. In reality, only a portion of an individual data line DL could actually be modified, such as only one of the bytes B in the addressed data line, but recall that the data lines are the minimum units of data accessible in an activated page P.

During a read-modify-write operation, the data path 204 and address remap circuitry 224 initially operate in the same way as described above for a read operation. Accordingly, the CPU 210 applies a read command in the form of appropriate control and address signals to the memory controller 202 over the processor bus 214. In response to the read command, the data path 204 and address remap circuitry 224 operate in combination to apply appropriate address and control signals over the bus 212 to activate a desired memory page P and access a selected data line DL in that page. The data path 204 also accesses the check byte CB and remaining data lines DL in the activated page as described above for a read operation. Once all addressed data lines DL have been read from the DRAM 208 and checked for errors, the data path supplies these words to the CPU 210 over the processor bus 214.

At this point, the CPU 210 modifies the data stored in one or more of these data lines DL but not all of the data lines. In the present description, it will be assumed that only one of the data words DW1-DW4 in an addressed data line DL is modified. The CPU 210 then applies a write command including the modified data line DL to the memory controller 202 via the processor bus 214. Only a portion of the line data word LDW in the form of the modified data line DL has at this point been changed, and thus such an access to the DRAM 208 is commonly termed a "partial-page access." Instead of immediately operating as described above for a write operation to write the modified data line DL into the accessed page P in the DRAM 208, the modified data line DL instead is applied to the write coalescing buffer 206.

Upon receiving the modified data line DL, the write coalescing buffer 206 stores the modified data line but does not initially supply the modified data line to the data path 204 to be written into the accessed page in the DRAM 208. In read-modify-write operations, the CPU 210 many times sequentially modifies the values of data lines DL contained in the accessed page P in the DRAM 208. The write coalescing buffer 206 functions to receive and store these sequentially modified data lines DL from the CPU 210. Once all the data lines DL contained in the accessed page P in the DRAM 208 have been modified or some other triggering event occurs, such as the CPU 210 applying a command accessing a different page within the DRAM, the write coalescing buffer 206 then at this point applies all-modified data lines to the data path 204. These modified data lines DL from the write coalescing buffer 206 are indicated as "coalesced line data" in FIG. 2.

In response to receiving these modified data lines DL from the write coalescing buffer 206, the data path 204 writes each of the modified data lines into the accessed page P in the DRAM 208 and calculates corresponding check bit portions of the check byte CB for these modified data lines. Once the data path 204 has written all modified data lines DL into the accessed page P in the DRAM 208, the data path generates the new check byte CB by combining the new check bit portions for the modified data lines DL with any unchanged check bit portions corresponding to data lines in the accessed page which have not been modified. After the new check byte CB has been generated, the data path 204 writes this check byte to the accessed page P in the DRAM 208 to complete the read-modify-write operation.

The data path 204 and write coalescing buffer 206 operate in combination to improve the efficiency the computer system 200 in executing read-modify-write operations. In conventional memory controllers, when ECC is implemented read-modify-write operations can result in sever performance penalties due to the calculations that must be performed by the memory controller during such operations. For example, if a single data line DL is modified in an accessed page P in the DRAM 208, a separate write operation would be performed in a conventional memory controller as each data word is modified. Each of these write operations takes time to perform, so subsequent memory accesses from the CPU 210 cannot be performed during this time. Moreover, each such write operation is particularly time consuming since although only one data line DL in the accessed page P has been modified, all data lines in the page must be accessed and combined with the modified data line to calculate a new check byte CB for all the data lines in the page. This new check byte CB must then be written to the accessed page P in the DRAM 208. By buffering partial-page accesses, only a single write operation containing all modified data lines DL in a given page P need be performed, and moreover only new portions of the check byte CB need by calculated for these new data lines so that unchanged data lines need not be accessed, as will be explained in more detail below.

Figure 4:
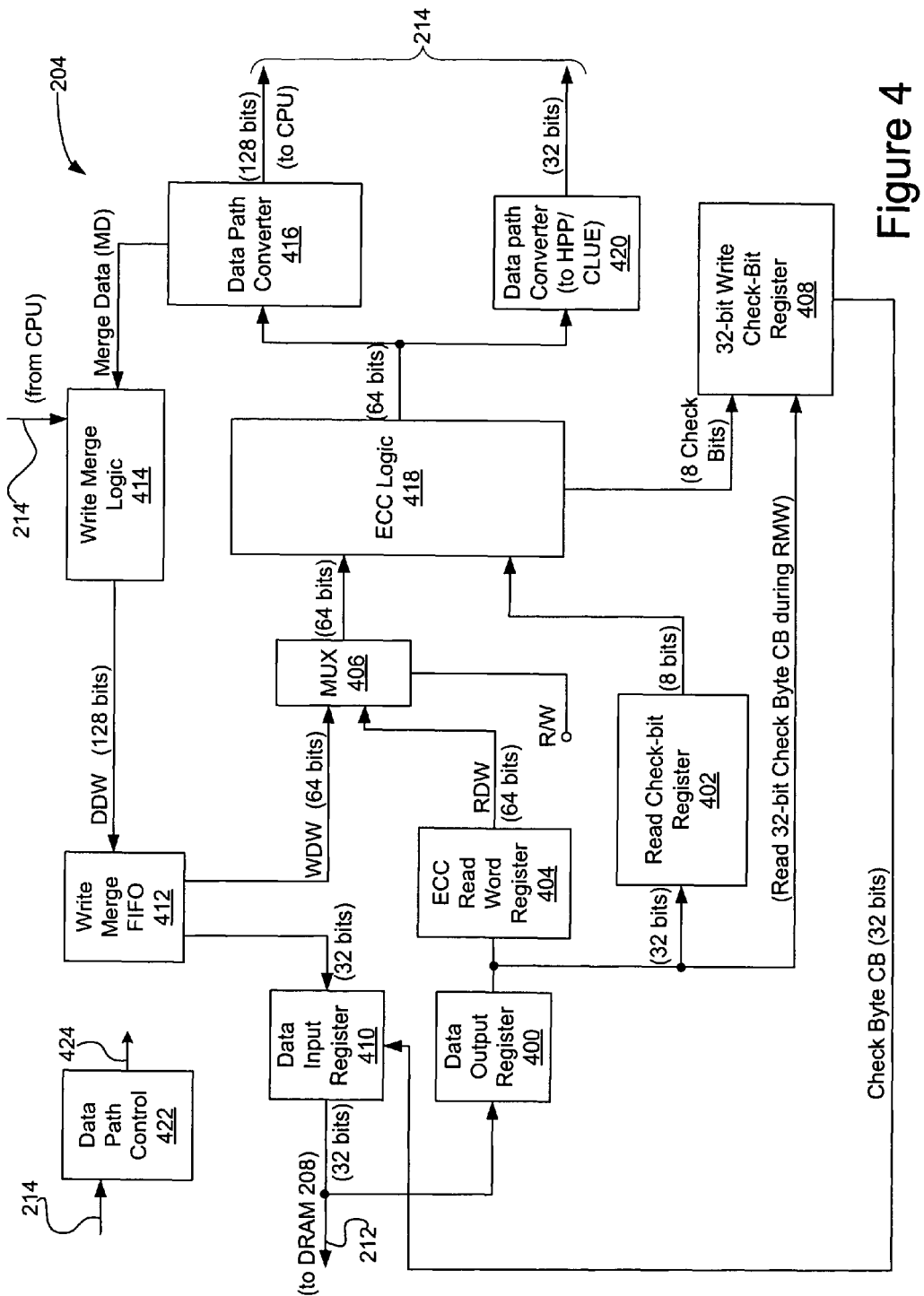
FIG. 4 is a more detailed functional block diagram of the ECC data path of FIG. 2 according to one embodiment of the present invention.

FIG. 4 is a more detailed functional block diagram of the ECC data path 204 of FIG. 2 according to one embodiment of the present invention. In the embodiment of FIG. 4, the data path 204 includes a data output register 400 that latches 32-bit data bytes DB applied on the memory bus 212 (FIG. 2) by the DRAM 208 (FIG. 2) during read operations. Recall, during a read operation the check byte CB (FIG. 3) in the page being read from the DRAM 208 is read out of the page first. The data output register 400 latches this check byte CB applied on the memory bus 212 and a read check-bit register 402 receives the check byte from the data output register and stores this value. The data output register 400 applies the subsequently latched bytes B1-B8 sequentially applied on the memory bus 212 to an ECC read word register 404.

The ECC read word register 404 combines pairs of the latched bytes B1-B8 to form the corresponding data words DW1-DW4 (FIG. 3) and supplies these data words to a first input of a multiplexer 406. The data words DW output from the ECC read word register 404 are designated read data words RDW. During read-modify-write operations, a write check-bit register 408 receives and stores the check byte CB latched by the data output register 400. The write check-bit register 408 operates during read-modify-write operations to merge modified portions of the check byte CB corresponding to modified data words DW with unchanged portions of the check byte received from the data output register 400. After having done so, the write check-bit register 408 supplies the newly generated check byte CB to a data input register 410 which, in turn, applies the newly generated check byte on the memory bus 212 at the appropriate time to store this check byte in the accessed page within the DRAM 208.

The data input register 410 also receives 32-bit data bytes B from a write merge first-in-first-out (FIFO) register 412 and applies these received data bytes on the memory bus 212 during write operations. The write merge FIFO register 412 receives 128 bit double data words DDW from write merge logic 414 and sequentially applies the bytes B in these double data words to the data input register as just mentioned. In addition, the write merge FIFO register 412 supplies each 64-bit data word DW in the received 128-bit double data word to a second input of the multiplexer 406. These data words DW applied to the second input of the multiplexer 406 are designated write data words WDW.

In the example embodiment of FIG. 4, the write merge logic 414 receives double data words DDW from the CPU 210 (FIG. 2) through the processor bus 214 and supplies these double data words to the write merge FIFO register 412. The write merge logic 414 also receives merge data MD during read-modify-write operations, with the merge data corresponding to data words DW read from the accessed page (FIG. 3) within the DRAM 208 (FIG. 2) that are not being modified at that point in time during the read-modify-write operation. Recall, each data line DL includes four data words DW1-DW4 and eight bytes B1-B8. In the description of the embodiment of FIG. 4, data being transferred between various points in the data path 204 will be described in terms of data words DW and bytes B instead of data lines DL merely for ease of description.

The data path 204 further includes ECC logic 418 that implements a suitable error checking and correction algorithm to check data words DW being read from the DRAM 208 during read operations and to calculate check bits for data words being written to the DRAM during write and read-modify write operations, as will be described in more detail below. In response to a read/write signal R/W being active, which defines a write operation, the multiplexer 406 applies the write data words WDW to the ECC logic 418. This occurs during standard write operations and during the write portion of a read-modify-write operation. When the read/write signal is inactive, which defines a read operation, the multiplexer 406 applies the read data words RDW to the ECC logic 418. This occurs during standard read operations and during the read portion of a read-modify-write operation.

During read operations, the ECC logic 418 also receives eight-bit check bit portions of the check byte CB stored in the read check-bit register 402 and utilizes these check bit portions to detect errors in the read data words RDW supplied by the multiplexer 406. Conversely, during write operations the ECC logic 418 generates eight-bit check bit portions using the 64-bit write data words WDW received from the multiplexer 406. The ECC logic 418 supplies the generated eight-bit check bit portions to the write check-bit register 408 which, in turn, utilizes these bits in forming the 32-bit check byte CB that is applied to the data input register 410, as will be described in more detail below.

During read operations, after the ECC logic 418 has checked the received read data words RDW for errors, assuming no errors the logic provides the RDW words to the data path converter 416. The data path converter 416 combines pairs of RDW words and provides a corresponding double data word DDW over the processor bus 214 to the CPU 210 (FIG. 2). As previously mentioned, the data path converter also feeds back the RDW words as merge data MD to the write merge logic 414. The merge data MD is used during read-modify-write operations, as will be discussed in more detail below. The data path 204 may further include a second data path converter 418 coupled to the ECC logic 418 to receive the read data words RDW and convert the data words into another form for transfer over the processor bus 214.

In the example of FIG. 4, the second data path converter 418 transfers the RDW words one 32-bit byte at a time over the bus 214 to the CPU 210 (FIG. 2) or some other device coupled to the bus. Finally, the data path 204 includes a control circuit 422 that generates a plurality of controls signals 424 to control the overall operation of the data path and write coalescing buffer 206 (FIG. 2). The control circuit 422 may be viewed as a control circuit for controlling the overall operation of the memory controller 202, and handles control of the components shown in the embodiment of FIG. 4 as well as interface with the CPU 210 and DRAM 208 of FIG. 2.

The overall operation of the embodiment of the data path 204 depicted in FIG. 4 will now be described in more detail. During a read operation, the CPU 210 of FIG. 2 supplies a read command including an address of the line in the DRAM 208 to be accessed as previously described with reference to FIG. 2. In response to the applied read command, the data path control circuitry 422 in the data path 204 applies appropriate control signals 424 on the memory bus 212 to access the desired line in the DRAM 208. The control circuit 422 thereafter clocks the data output register 400 to sequentially clock 32-bit bytes B in the accessed page into the data output register. As previously described, the first byte clocked into the data output register 400 is the check byte CB. The data output register 400 provides the check byte CB to the read check-bit register 402 which stores the check byte. Subsequent 32-bit bytes B clocked into the data output register 400 are thereafter sequentially stored in the ECC read word a register 404. The ECC read work register 404 combines pairs of these bytes B to generate the corresponding read data word RDW that is applied to the first input of the multiplexer 406. For example, the register 404 combines 32-bit bytes B1 and B2 from the accessed page to thereby formed a data word DW1, and the register 404 thereafter outputs this data word as the RDW word. Because this is a read operation, the control circuit 422 drives the read/write signal R/W inactive, causing the multiplexer 406 to supply the RDW word applied on the first input to the ECC logic 418.

At this point, assume the first RDW word corresponding to the data word DW1 (FIG. 3) is output from the read word register 404 and applied through the multiplexer 406 to the ECC logic 418. The read check-bit register 402 at this point outputs the eight check bits in the check byte CB that correspond to the first RDW word currently applied to the ECC logic 418. The ECC logic 418 utilizes the applied eight check bits from the register 402 to determine whether the applied first RDW word contains any errors. Assuming no errors are detected, the ECC logic 418 then supplies the first RDW word to one of the data path converters 416 and 420 which, in turn, appropriately transfers the data word over the processor bus 214 to the CPU 210 (FIG. 2). For example, where the first 64-bit RDW word is applied to the data path converter 416, the converter waits for a second 64-bit RDW word (to be discussed next below) and thereafter transfers these first and second RDW words as a single double data word DDW over a corresponding 128 bit data bus portion of the processor bus 214. In the following description, it is assumed the ECC logic 418 outputs all RDW words to the data path converter 416.

After the ECC logic 418 has completed detecting errors in the first RDW word, the second RDW word corresponding to the data word DW2 (FIG. 3) is output from the read word register 404 and applied through the multiplexer 406 to the ECC logic 418. The read check-bit register 402 at this point outputs the eight check bits in the check byte CB that correspond to the this second RDW word. The ECC logic 418 thereafter operates in the same way, utilizing the applied eight check bits from the register 402 to determine whether the second RDW word contains any errors. Assuming no errors are detected, the ECC logic 418 then supplies the second RDW word to the data path converter 416 which, in turn, appropriately transfers the data word over the processor bus 214 to the CPU 210.

The ECC logic 418 continues operating in this matter, receiving the next RDW word from the ECC read word register 404 via the multiplexer 406 and the corresponding eight check bits from the read check-bit register 402 and determining whether RDW word contains any errors utilizing the check bits. Assuming no errors, each RDW word is output from the ECC logic 418 to the data path converter 416 and thereafter transferred over the processor bus 214 to the CPU 210. Note that if at any point the ECC logic 418 detects an error in one of the RDW words, the ECC logic generates an error flag that is communicated through the data path converter 416 and over the bus 214 to the CPU 210.

In operation during a write operation, the CPU 210 of FIG. 2 supplies a write command including an address of the page in the DRAM 208 to be accessed as previously described with reference to FIG. 2. In response to the applied write command, the data path control circuitry 422 in the data path 204 once again applies appropriate control signals 424 on the memory bus 212 to access the desired page in the DRAM 208. The CPU 210 thereafter supplies the data words DW to be written into the accessed page to the data path 204 over the processor bus 214. More specifically, two 264-bit data words DW are combined to form a single double data word DDW that is applied to the write merge logic 414.

The write merge logic 414 thereafter supplies each received 128-bit double data word DDW to the write merge FIFO register, which sequentially stores the received DDW words and outputs them one write data word RDW at a time to the second input of the multiplexer 406. Each RDW word corresponds to one of the data bytes DW1-DW4 to be stored in the accessed page in the DRAM 208. Because the current operation is write operation, the control circuit 422 activates the R/W signal, causing the multiplexer 406 to apply each RDW word from the write merger FIFO register 412 to the ECC logic 418.

During the write operation, 128-bit double data words DDW supplied from the CPU 210 over the processor bus 214 are transferred through the write merge logic 414 to the write merge FIFO register 412. The write merge FIFO register 412 thereafter sequentially applies 64-bit write data words WDW through the multiplexer 406 to the ECC logic 418. For each received WDW word, the ECC logic 418 applies the error checking and correction algorithm to generate the corresponding check bits. In the example of FIG. 4, each WDW word is 64 bits and ECC logic 418 generates eight check bits for each such 64-bit WDW word. The ECC logic 418 supplies each generated group of eight check bits to the write check-bit register 408, which stores the check bits.

The write merge FIFO register 412 sequentially applies each 64-bit write data word WDW through the multiplexer 406 to the ECC logic 418, and for each such word the ECC logic 418 generates the corresponding eight check bits and supplies these to the write check-bit register 408. Four WDW words corresponding to the data words DW1-DW4 are contained in the page being accessed in the example embodiments of the data 204 of FIG. 4. Thus, after the ECC logic 418 has generated the corresponding eight check bits for each of the four WDW words, the write check-bit register 408 stores 32 bits and thereby stores the check byte CB for the four write data DW1-DW4 being written to the accessed page.

While the ECC logic 418 is generating the check byte CB, the data input register 410 is writing 32-bit bytes B that collectively form the data words DW1-DW4 into the DRAM 208 via the memory bus 212. Are specifically, as the write merge FIFO register 412 is supplying the WDW words to the multiplexer 406, the FIFO register is also applying these words when byte B at a time to the data input register 410. In this way, as the data path 204 is calculating the check byte CB for the data words DW1-DW4 being written to the accessed page, the data path is simultaneously writing these data words when byte B at a time to the accessed page via the write merge FIFO register 412 and data input register 410. Accordingly, once all four data words DW1-DW4 have been written to the accessed page, the write check-bit register 408 supplies the check byte CB for these four data words to the data input register 410 and the data input register writes the check byte into the accessed page thereby completing the write operation.

In operation during a read-modify-write operation, the CPU 210 (FIG. 2) initially supplies a read command including an address of the page in the DRAM 208 to be accessed. The data path 204 thereafter operates as previously described during a read operation to output from the data path converter 416 double data words DDW. Thus, the check byte CB in the accessed page is clocked out of the data output register 400 and stored in the read check-bit register 402. In contrast to a conventional read operation, during a read-modify-write operation note that the check byte CB from the data output register 400 is also stored in the write check-bit register 408.

At this point, as each of the double data words DDW is output from the data path converter 416 onto the processor bus 214, the data path converter also feeds back the double data word in the form of merge data MD to the write merge logic 414. In this way, the write merge logic 414 stores the data words DW that have just been read from the accessed page in the DRAM 208. The write check-bit register 408 also stores the check byte CB for the data words DW just read from the accessed page.

The CPU 210 has at this point read the desired data words DW from the accessed page of the DRAM 208. Now, the CPU 210 modifies one of the data words DW just read from the accessed page. The CPU 210 thereafter transfers the modified data word DW over the processor bus 214 to the write merge logic 414. Recall, the write merge logic 414 stores the merge data MD corresponding to the data words DW just read from the accessed page. The write merge logic 414 at this point combines or merges the modified data word DW just received from the CPU 210 with the merge data MD. More specifically, the merge logic 414 replaces data word DW in the merge data MD that has been modified with the modified data word DW. For example, assume that the byte B3 (FIG. 3) has been modified and thus the CPU 210 writes back a new value for the data word DW2. The write merge logic 414 in this situation replaces the old data word DW2 with the modified data word DW2.

At this point, the write merge logic 414 supplies the modified data word DW to the write merge FIFO register 412. The write merge FIFO register 412 thereafter operates as previously described to supply the modified data word DW in the form of the WDW word through the multiplexer 406 to the ECC logic 418. The ECC logic 418 then calculates a new group of eight check bits for the modified data word DW and provides these check bits to the write check-bit register 408. Recall, the write check-bit register 408 at this point stores the original check byte CB read from the accessed page. The write check-bit register 408 now replaces the group of eight bits in the check byte CB corresponding to the old data word DW with the new group of eight check bits for the modified data word. Accordingly, the write check-bit register 408 now stores a new check byte CB having a new value resulting from the modified data word DW.

At this point, the modified data word DW stored in the write merge FIFO register 412 is applied a byte B at a time to the data input register 410 which, in turn, transfers the modified data word a byte at a time over the memory bus 212 and into the accessed page in the DRAM 208. After the modified data word DW has been written into the accessed page, the new check byte CB stored in the write check bit register 408 is applied to the data input register 410. The data input register 410 thereafter transfers the new check byte over the bus 212 and into the accessed page in the DRAM 208, thereby completing the read-modify-write operation.

Referring back to FIG. 2, in one embodiment the address remap circuitry 224 implements address remapping of logical addresses from the CPU 210 to physical addresses for the DRAM 208 according to a three part remapping algorithm that avoids bank conflicts. In one embodiment, the algorithm remaps logical addresses such that the least significant burst size bits (bits 5:4) in the received logical address are mapped to the bank bits for the DRAM 208 to enable bank rotation within a 512-bit transfer. The algorithm also remaps the logical address such that the row bits between the logical addresses and the corresponding physical addresses are the same. In other words, the algorithm maps physical address bits ($3'b111$) to the column bits to thereby enable same page access for check bits CB addresses and the corresponding data line addresses. This means that the most significant logical bits need to be mapped to the column bits. Finally, the algorithm remaps the remaining address bits to increase page hit probability during sequential memory accesses to thereby improve performance of the CPU 210 and the overall computer system 200.

Even though various embodiments have been set forth in the foregoing description, the above disclosure is illustrative only, and changes may be made in detail and yet remain within the broad principles of the present invention. For example, the functions performed by components in the computer system 200 of FIG. 2 and the ECC data path 204 of FIG. 3 can be combined to be performed by fewer elements, separated and performed by more elements, or combined into different functional blocks depending upon the actual components used in implementing these components as well as design criteria in a given application, as will be appreciated by those skilled in the art. Furthermore, the DRAM 208 is a functional representation of memory and the precise form of this memory may vary in different applications of the present invention. For example, the DRAM 208 may include a single DRAM chip or may include multiple memory chips, and although indicated as DRAM the memory may be different types of memory as well, such as FLASH memory or static random access memory (SRAM), and so forth. Therefore, the present invention is to be limited only by the appended claims.

What is claimed is:

1. A method of storing data and check bits for that data within a memory chip, the memory chip storing the data and check bits in a plurality of pages contained in the memory chip, each page including a plurality of storage locations with each storage location having an associated address, the method comprising:

receiving data to be stored in the memory, wherein the data comprises a plurality of data lines having a plurality of data words;

calculating a separate set of check bits for each individual data word as the individual data word is received;

mapping each individual data word to an address associated with the storage locations in a given page in the memory chip;

mapping each separate set of check bits to an address associated with the storage locations contained in the same page of the memory chip as the data word to which said separate set of check bits corresponds;

storing each data word and the separate set of check bits corresponding to that data word in the same page of the memory chip; and during a read-modify-write operation, merging modified check bits corresponding to modified data words with unchanged check bits corresponding to unchanged data words to form a new set of check bits stored in the same page as the corresponding modified and unchanged data words.

2. A method of storing data and check bits for that data within a memory chip, the memory chip storing the data and check bits in a plurality of pages contained in the memory chip, each page including a plurality of storage locations with each storage location having an associated address, the method comprising:

receiving data to be stored in the memory, wherein the data comprises a plurality of data lines having a plurality of data words;

calculating a separate set of check bits for each individual data word as the individual data word is received;

mapping each individual data word to an address associated with the storage locations in a given page in the memory chip;

mapping each separate set of check bits to an address associated with the storage locations contained in the same page of the memory chip as the data word to which said separate set of check bits corresponds; and storing each data word and the separate set of check bits corresponding to that data word in the same page of the memory chip;

wherein the data stored in each page includes a plurality of data words, the data words collectively forming the data stored in the page and the method further comprising:

reading at least one data word stored in a page in the memory chip that is to be modified;

modifying the at least one data word;

storing all the modified data words in a buffer; and when all data words to be modified have been modified or in response to a triggering event, obtaining the current values of all data words to be stored in the page;

from the current values of all the data words, generating new check bits for the data words; and storing the new check bits and the current values for the data words in the page.

3. The method of claim 2 wherein the triggering event comprises receiving an address indicating data stored in another page in the memory chip is to be accessed.

4. The method of claim 1 further comprising reading data and check bits stored in pages in the memory chip, the operation of reading comprising:

reading the check bits from a given page;

after reading the check bits, sequentially reading data words that collectively form the data stored in the given page;

as each data word is read, using the check bits to determine whether there are any errors in the read data word.

5. The method of claim 1 wherein storing data and check bits for that data within the memory chip further comprises:

receiving data words to be written to a given page in the memory chip;

as each data word is received, generating corresponding check bits;

writing each data word to the corresponding page;

once all data words for the page have been received, writing the check bits to the page.

6. The method of claim 1 wherein the data includes a plurality of bits and wherein storing the data and check bits in the page comprises storing respective bits in the form of a charge stored on a capacitor, with a first charge being stored when the bit has a first logic value and a second charge being stored when the bit has a second logic value.

7. A data path having a memory bus configured to be coupled to a memory device and a processor bus configured to be coupled to a processor, the data path being, operable during a write mode of operation to receive on the processor bus respective data words to be stored in the memory device and to generate a separate set of corresponding check bits for each received data word, the data path being further operable to store the data words and an error checking word including the separately generated set of check bits for each of the data words in a same page in the memory device; and operable during a read mode of operation to receive on the memory bus the data words and the error checking word from a same page in the memory device, and the data path being further operable to utilize the bits in the error checking word to detect errors in individual received data words, wherein error checking of a set of words from a page in the memory device using check bits from that same page is performed simultaneously with a next set of words from that same page in the memory device being latched.

8. The data path of claim 7 wherein the data path is further operable during the write mode of operation to generate, as each data word is received, corresponding check bits in the error checking word, and the data path further operable to sequentially write each received data word to the corresponding page in the memory device, and operable after all data words of the page have been written to write the error checking word to the page.

9. The data path of claim 7 wherein the data path is further operable during the read mode of operation to first receive on the memory bus the error checking word from a given page being accessed and to thereafter sequentially receive data words on the memory bus that collectively form the data stored in the given page, and the data path being further operable to utilize the check bits in the error checking word to sequentially determine whether each received data word contains any errors as each data word is received.

10. The data path of claim 7 further comprising:

a data read path including, a data output register coupled to the memory bus and operable to latch data bytes applied on the memory bus from a page being accessed, and operable to provide each latched data byte on an output;

a read check-bit register coupled to the output of the data output register to receive and store an ECC data byte corresponding to the first one of the data bytes latched by the data output register, and operable to sequentially output portions of the latched ECC data byte;

an ECC read word register coupled to the data output register to receive and store latched data bytes from the data output register, and operable to output data words, each data word corresponding to combination of two or more data bytes;

a multiplexer having a first input coupled to the ECC read word register, a second input, and a control input configured to receive a read/write control signal, the multiplexer operable to provide data words from the ECC read word register on an output responsive to the read/write signal indicating a read operation;

an ECC logic circuit coupled to the output of the multiplexer and coupled to the read check-bit register, the ECC logic circuit operable during read operations to sequentially receive data words from the ECC read word register via the multiplexer and to sequentially receive portions of the ECC data byte from the read check-bit register, the ECC logic operable to determine whether each received data word contains any errors using the corresponding portion of the ECC data byte and to provide the data words on the processor bus along with an indication of whether any errors were detected.

11. The data path of claim 10 further comprising:

a data write path including, a write merge logic circuit coupled to the processor bus and operable during write operations to latch data words applied on the processor bus and to provide the latched words on an output and operable during read-modify-write operations to latch a modified byte or bytes applied on the processor bus and to combine this modified byte or bytes with data words from the ECC logic circuit and provide these combined modified byte or bytes and data words on the output;

a write merge FIFO register coupled to the write merge logic circuit and having a first output coupled to the second input of the multiplexer and having a second output, the write merge FIFO operable during write operations to provide data words received from the write merge logic circuit on the second output and operable during read-modify-write operations to provide data words including the modified byte or bytes on the first output and to provide data bytes being written to the memory device on the second output;

a data input register coupled to the memory bus and having a first input coupled to the second output of the write merge FIFO and having a second input configured to receive the ECC data byte corresponding to the data bytes in a given page, the data input register operable to apply data bytes received from the write merge FIFO on the memory bus and operable after all bytes in the given page have been applied on the memory bus to apply the ECC data byte on the memory bus;

a write check-bit register having a first input coupled to the ECC logic circuit to sequentially receive portions of a new ECC data byte generated by the ECC logic circuit during write operations, each portion corresponding to a value calculated for data words being written to the memory device during write operations, and the write check-bit register further including a second input coupled to the data output register to receive the ECC data byte for the page being accessed in the memory device during a read-modify-write operation, the write check-bit register being operable during read-modify-write operations to receive at least one new portion of the ECC data byte from the ECC logic circuit for the data word including the modified byte or bytes in the page being accessed, and to merge each new portion with the other unchanged portions of the ECC data byte and to output the ECC data byte including each new portion to the data input register;

the ECC logic circuit operable during write operations to receive data words being written to a page in the memory device from the multiplexer and operable to generate a portion of an ECC data byte for that page from each applied data word, and operable to apply each generated portion of the ECC data byte to the first input of the write check-bit register, and the ECC logic circuit operable during read modify write operations to supply to the first input of the write check-bit register the portion of ECC data byte corresponding to a data word including the modified byte or bytes.

12. The data path of claim 11 wherein the each data byte is 32-bits wide and each data word is 64-bits wide.

13. The data path of claim 7 further comprising a write coalescing buffer coupled to the processor bus, the write coalescing buffer operable to store modified bytes being written to a given page within the memory device until a triggering event occurs or until all bytes in that page have been modified, and operable during the write mode to thereafter supply all modified bytes to the data path for storage along with the corresponding check bits in a respective page in the memory device.

14. The data path of claim 7, further comprising a memory system, comprising:
a memory device having address, data, and control busses collectively referred to as a memory bus;
a processor having address, data, and control busses collectively referred to as a processor bus; and
a memory controller coupled to the memory bus of the memory device and coupled to the processor bus of the processor, the memory controller including a data path that is,
operable during a write mode of operation to receive on the processor bus respective data words to be stored in the memory device and to generate a separate set of corresponding check bits for each received data word, the data path being further operable to store the data words and an error checking word including the check bits in a same page in the memory device; and
operable during a read mode of operation to receive on the memory bus the data words and the error checking word from a same page in the memory device, and the data path being further operable to utilize the bits in the error checking word to detect errors in the received data words.

15. The memory system of claim 14 wherein the memory device comprises a plurality of DRAMs, with the data path being operable to store in each page of each of the memory devices data words and an error checking word corresponding to those data words.

16. The memory system of claim 14, further comprising address remap circuitry configured to:
remap a logical address received from the processor such that least significant burst size bits in the received logical address are mapped to bank bits for the memory device to enable bank rotation within a 512-bit transfer;
remap the logical address such that row bits between the logical addresses and corresponding physical addresses are the same; and
remap remaining address bits in the received logical address to increase page hit probability during sequential memory accesses to thereby improve performance of the processor.

17. The method of claim 1, wherein each data word comprises two 32-bit bytes.

18. The method of claim 1, wherein the calculated check bits for the individual data words comprise eight check bits per data word.

19. The data path of claim 7, wherein the data words are located at an addressed data line and the data path is operable during the read mode of operation to sequentially receive bytes comprising the data words for the addressed data line after receiving a corresponding check byte representing the error checking word, wherein the page comprises a plurality of check bytes which are receivable using the data path one byte at a time for utilization in detecting the errors in the received data words sequentially, as the data words are received.

20. The data path of claim 10, wherein the ECC logic circuit is operable to sequentially determine whether each received data word contains errors by using corresponding bits from the corresponding portion of the ECC data byte, and wherein the data output register is operable to latch a second data word simultaneously as the determination of errors in a first data word are made, wherein the received data words comprise data words from a same data line among a plurality of data lines in the page.

* * * * *